United States Patent [19]

Iwatsuka et al.

[11] Patent Number: 5,619,367

[45] Date of Patent: Apr. 8, 1997

[54] APPARATUS AND METHOD FOR MEASURING MAGNETIC FIELDS EMPLOYING MAGNETO-OPTIC ELEMENT

[75] Inventors: Shinji Iwatsuka; Yoshikazu Narumiya; Makoto Nakazawa, all of Tokyo, Japan

[73] Assignee: TDK Corporation, Tokyo, Japan

[21] Appl. No.: 526,336

[22] Filed: Sep. 11, 1995

Related U.S. Application Data

[62] Division of Ser. No. 892,468, Jun. 2, 1992, Pat. No. 5,477,376.

[30] Foreign Application Priority Data

| Jun. 4, 1991 | [JP] | Japan | 3-159500 |
| Oct. 28, 1991 | [JP] | Japan | 3-281737 |
| Oct. 28, 1991 | [JP] | Japan | 3-281738 |
| Mar. 4, 1992 | [JP] | Japan | 4-81398 |

[51] Int. Cl.$^6$ ............................ G02F 1/09
[52] U.S. Cl. ............. 359/283; 359/281; 385/6
[58] Field of Search ............... 359/280, 283, 359/7, 576; 365/29; 385/6, 12

[56] References Cited

U.S. PATENT DOCUMENTS

| 3,515,457 | 6/1970 | Dillon, Jr. | 359/280 |
| 3,814,081 | 6/1974 | Mori et al. | 385/12 |
| 4,082,424 | 4/1978 | Sauter et al. | 385/6 |
| 4,148,556 | 4/1979 | Sauter et al. | 350/96.13 |
| 4,554,449 | 11/1985 | Taniuchi et al. | 250/227 |
| 4,581,579 | 4/1986 | Nagatsuma et al. | 324/244 |
| 4,604,577 | 8/1986 | Matsumura et al. | 324/244 |
| 4,770,504 | 9/1988 | Hansen et al. | 359/283 |
| 5,075,546 | 12/1991 | Kamada et al. | 250/231.1 |
| 5,152,597 | 10/1992 | Barnard | 359/283 |

FOREIGN PATENT DOCUMENTS

| 1194233 | 9/1985 | Canada | 365/29 |
| 1-223359 | 9/1989 | Japan . | |
| 2-2508 | 1/1990 | Japan . | |

OTHER PUBLICATIONS

Japanese Utility Model Application Public Disclosure No. 63-128522 (Aug. 23, 1988) (no translation).

*Primary Examiner*—Georgia Y. Epps
*Assistant Examiner*—Thomas Robbins
*Attorney, Agent, or Firm*—Seidel, Gonda, Lavorgna & Monaco, PC

[57] ABSTRACT

A magneto-optic element is employed to create an optical attenuator, an optical modulator and a magnetic field strength sensor. The magneto-optic element exhibits a multiple domain structure in a state where no magnetic field is applied, wherein magnetization components in adjacent domains of the element along a direction in which a light beam travels are different from one another. The optical attenuator further includes apparatus for applying a magnetic field of variable strength to the magneto-optic element. The optical modulator further includes apparatus for applying a modulated magnetic field to the magneto-optic element. The magnetic field strength sensor operates by placing the magneto-optic element in the vicinity of an object to be measured. A light beam is directed from an input optical fiber onto the magneto-optic element and the element diffracts the light beam. A portion of the light beam exiting the element impinges on a reflector and is received by a second optical fiber. In the optical attenuator, that portion of light is attenuated with respect to the light in the input optical fiber. In the optical modulator, that portion of light is modulated with respect to the light in the input optical fiber. In the magnetic field strength sensor, that portion of light is representative of the magnetic field of the object in the vicinity of the magneto-optic element.

11 Claims, 10 Drawing Sheets

APPARATUS AND METHOD FOR MEASURING MAGNETIC FIELDS EMPLOYING MAGNETO-OPTIC ELEMENT

This is a divisional of application Ser. No. 07/892,468 filed on Jun. 2, 1992 now U.S. Pat. No. 5,477,376.

BACKGROUND OF THE INVENTION

The present invention relates to novel optical attenuators and optical modulators both using a magneto-optic element that utilizes diffraction phenomena.

The invention relates also to novel magnetic field sensors using a magneto-optic element that utilizes diffraction phenomena.

The invention further concerns a magnetic field (electric current) measuring apparatus and a method suited for the magnetic field (electric current) measurement of power transmission and distribution lines. More particularly, the invention concerns a novel magnetic field measuring apparatus and a method therefor using a sensor unit which is extremely simple in structure and operates independently of service temperature.

An optical attenuator is a device for adjusting the intensity of light incident upon a light-receiving or image pickup element to an optimum value. In optical communications the losses in transmission lines due to splicing, connection, relaying, branching, etc. are much variable, and the intensity of light incident upon the light-receiving unit also varies greatly owing to the losses in optical fibers themselves. To reduce the light intensity to within the dynamic range of the receiver, therefore, optical attenuators are very often employed. Optical attenuators are in frequent use too for the evaluation, calibration, etc. of the performance and reliability of other communication equipment and optical measuring instruments.

Optical attenuators of the prior art use ND filters and are known to be of two types; fixed attenuators which provide a fixed amount of attenuation and variable attenuators which provide variable attenuation. FIG. 2 illustrates a variable attenuator in common use as comprising an attenuator unit 5 of a variable structure and a collimator unit 3. The attenuator unit of the variable attenuator, as shown in FIG. 3, consists of a step-variable attenuation plate 6 and a continuously variable attenuation plate 7. Generally, the former plate includes ND filters arranged turnably for shifting stepwise by 10 dB, and the latter include ND filters so arranged as to change the amount of attenuation continuously from the angle of rotation to cover somewhat broader ranges (e.g., 0–15 dB) than the step width of the former.

The optical attenuators using ND filters, which involve mechanical rotation of the filters for the setting of attenuation amounts, are complex in construction. Moreover, the presence of movable parts in the optical system makes their reliability questionable.

Another type of optical attenuator, a variable attenuator utilizing a magneto-optic effect, is known (Japanese Utility Model Application Public Disclosure No. 63-128522). That attenuator is advantageous in that it has no moving part because the amount of attenuation is adjustable with external magnetic fields. However, it requires polarization prisms to be disposed on both sides of the magneto-optic element so that a particular polarized light component can be taken out to adjust the intensity of light.

Patent Application Public Disclosure No. 2-2508 teaches a variable attenuator that uses a magneto-optic element and depends on diffraction loss for attenuation. The attenuator necessitates no polarization prism and is simple in construction. Its limitation is the inability of continuously changing the attenuation due to on-off control of a solenoid coil.

U.S. Pat. No. 4,148,556 to G. F. Sauter et al. discloses a device capable of modulating the intensity of multimode light beam by taking advantage of the magneto-optic effect. This technique takes out the diffracted light beam into optical fibers and does not utilize only the light beam directed straightly ahead as an output signal.

Magnetic field sensors, using light as a medium, show good insulation and inertness to the influence of electromagnetic induction. These characteristics make them useful in the current measurement for transmission lines and other similar services. In FIG. 17 is shown a typical magnetic field measuring apparatus of the prior art. The optical system of the apparatus is made up of a magneto-optic element 1, optical fibers 4, 4', collimator lenses 3, 3', a polarizer 17, and an analyzer 18. A beam of light emerging from a light source 28 is divided by the collimator lens 3 into parallel rays of light, which in turn are led through the polarizer to form a linearly polarized light. Application of a magnetic field to the magneto-optic element 1 produces a sufficient Faraday effect to cause the plane of polarization of the linearly polarized light to turn in proportion to the strength of the magnetic field. As this light beam passes through the analyzer 18, the quantity of light is changed by the angle of the polarization plane. The light is then collected by the collimator lens 3' into the optical fiber 4' to be detected by a light-receiving element 28.

Here the light beam that has passed the analyzer is divided into two; the light component that oscillates at the magnetic field frequency ω and the light component corresponding to the DC component, and the intensity of light I(ω) to Io is expressed as $$I(\omega)/Io = 2V_r L H\omega$$

where Hω is the AC magnetic field strength of an object being measured that oscillates at the frequency ω, $V_r$ is the Verdet's constant of the Faraday element, and L is the thickness of the Faraday element. The magnetic field strength Hω is simply found from the I(ω)/Io by means of a divider 24.

On the other hand, such a magnetic field measuring apparatus has the disadvantage of complex construction of the sensor itself owing to the necessity of disposing the polarizer and analyzer on the opposite sides of the magneto-optic element. An additional limitation is that, the Verdet's constant $V_r$ of the magneto-optic element being a function of temperature, the measuring environment must be kept constant.

Yet another magnetic field measuring apparatus known in the art is an optical apparatus for measuring electric current or magnetic field revealed, e.g., by Patent Application Public Disclosure No. 1-223359. This apparatus measures a magnetic field by applying a given bias magnetic field different from the AC magnetic field to be measured to the Faraday element of a sensor head, taking out an angular frequency component (Eω) which is the same as that of the AC magnetic field of the light beam that passes through the Faraday rotator and a double angular frequency component (E2ω) which is twice as much as that of the AC magnetic field, and finding the value of the double angular frequency component (E2ω) relative to the same angular frequency component (Eω). This technique is advantageous over the other prior art techniques in that the magnetic field strength can be determined in dependently of the $V_r$ that is a function of temperature.

However, like the other conventional techniques, the magnetic field measuring apparatus of Patent Application Public Disclosure No. 1-223359 too must have a polarizer and an analyzer located on both sides of the magneto-optic element. In addition, it requires means for applying a bias magnetic field, thus making the sensor structure more complex than those of the other techniques.

U.S. Pat. No. 4,554,449 to T. Taniuchi et al., U.S. Pat. No. 4,604,577 to H. Matsumura et al., and U.S. Pat. No. 4,581,579 to K. Nagatsuma et al. all teach magnetic field sensors for optical fibers that make use of the Faraday effect. A drawback common to them is the use of a polarizer and an analyzer as with the above-mentioned apparatuses of the prior art.

It is an object of the present invention to provide a novel optical attenuator capable of easily adjusting the amount of attenuation without the need of moving parts and which can be simplified in overall structure.

Another object of the invention is to provide a novel optical modulator capable of easily adjusting the amount and frequency of modulation without the need of moving parts and which can be simplified in overall structure.

Another object of the invention is to provide a novel magnetic field sensor and magnetic field measuring apparatus of a simplified structure each which requires neither polarizer nor analyzer.

Still another object of the invention is to provide a novel magnetic field measuring method which requires neither polarizer nor analyzer.

A further object of the invention is to provide an apparatus and a method for measuring the magnetic fields of transmission lines, etc. without the need of a polarizer, analyzer, or bias-applying means.

The optical attenuators and modulators of the present invention have now been perfected on the basis of the discovery that the use of a magneto-optic material of perpendicular magnetization in a variable applied magnetic field makes it possible to adjust continuously the quantity of light that passes through the material by dint of diffraction phenomena. It has also been found that incorporation of a reflector in the optical system allows the optical attenuators and modulators of the invention to achieve further improvements in the amount of optical attenuation. Further, the sensors and the apparatus and method for magnetic field measurement capable of measuring external magnetic fields without the need of a polarizer or analyzer but by the passage of a light beam through the above-mentioned magneto-optic material of perpendicular magnetization.

SUMMARY OF THE INVENTION

This invention resides in an optical attenuator capable of continuously attenuating optical power comprising a magneto-optic element which exhibits a multiple domain structure in the state where no magnetic field is applied, the magnetization components in the adjacent domains along the direction in which a light beam travels being different from one another, and means whereby a magnetic field of variable strength can be applied to said magneto-optic element. The optical attenuator preferably includes input and output means for optical signals and one or more reflectors provided on at least one side of the magneto-optic element.

The invention resides also in an optical modulator comprising a magneto-optic element which exhibits a multiple domain structure in the state where no magnetic field is applied, the magnetization components in the adjacent domains along the direction in which a light beam travels being different from one another, and means whereby a modulated magnetic field can be applied to said magneto-optic element. The optical modulator preferably includes two optical fibers disposed in parallel on one side of the magneto-optic element and one or more reflectors on the opposite side.

The invention further resides in a magnetic field sensor comprising a magneto-optic element which exhibits a multiple domain structure in the state where no magnetic field is applied, the magnetization components in the adjacent domains along the direction in which a light beam travels being different from one another. The magnetic field sensor preferably includes one or two optical fibers disposed in parallel on one side of the magneto-optic element and one or more reflectors on the opposite side.

When the optical attenuator, optical modulator, or magnetic field sensor is to use a reflector, the latter is preferably formed by vapor deposition or the like on the magneto-optic element. The attenuator, modulator, or sensor may have a plurality of magneto-optic elements arranged in tandem in the direction of light travel. Desirably, the magneto-optic elements use a Bi-substituted rare earth iron garnet film formed by liquid-phase epitaxial (LPE) growth.

In another aspect, the invention resides in a magnetic field measuring apparatus comprising a magneto-optic element which exhibits a multiple domain structure in the state where no magnetic field is applied, the magnetization components in the adjacent domains along the direction in which a light beam travels being different from one another, emitter means for directing a light beam incident to the surface of the element, means for finding the intensity of light $I(2\omega)$ of a light component, out of the zero order diffraction light that has passed through the magneto-optic element, which oscillates at a frequency twice as high as the magnetic field frequency $\omega$ of the object of magnetic field measurement, means for finding the intensity of light Io of a light component corresponding to the DC component of the zero order diffraction light, and means for finding the ratio $I(2\omega)/Io$.

When, in the above magnetic field measuring apparatuses, the magneto-optic elements are made of a Bi-substituted rare earth iron garnet, the elements desirably are of such thickness as to limit the temperature dependence of $H_s/\tan\Theta_f$ where $\omega_f$ is the Faraday rotation angle and $H_s$ is the saturation magnetization.

In yet another aspect, the invention resides in a magnetic field measuring apparatus comprising a magneto-optic element which exhibits a multiple domain structure in the state where no magnetic field is applied, the magnetization components in the adjacent domains along the direction in which a light beam travels being different from one another, emitter means for directing a light beam incident to the surface of the element, magnetic field applicator means for applying a given bias magnetic field to the magneto-optic means, means for finding the intensity of light $I(\omega)$ of a light component, out of the zero order diffraction light that has passed through the magneto-optic element, which oscillates at the magnetic field frequency $\omega$ of the object of magnetic field measurement and the intensity of light $I(2\omega)$ of a light component which oscillates at a frequency twice as high as the light intensity $I(\omega)$, and means for finding the ratio $I(2\omega)/I(\omega)$.

In still another aspect, the invention resides in a method of measuring the magnetic field of an object which generates a magnetic field to be measured, which process comprises directing a light beam, in the vicinity of the object, incident to a magneto-optic element which exhibits a multiple domain structure in the state where no magnetic field is applied, the magnetization components in the adjacent domains along the direction in which a light beam travels being alternately parallel and antiparallel to the light beam direction, taking out only zero order diffracted light from the diffracted light that has passed through said magneto-optic element, determining separately, out of the zero order diffraction light, the intensity of light I(2ω) of a light component which oscillates at a frequency twice as high as the magnetic field frequency ω of the object of magnetic field measurement and the intensity of light Io of a light component corresponding to the DC component, and then finding the ratio I(2ω)/Io.

In a further aspect, the invention resides in a method of measuring the magnetic field of an object whose magnetic field is to be measured, which method comprises, with concurrent application of a given bias magnetic field, directing a light beam, in the vicinity of an object which generates a magnetic field and whose magnetic field is to be measured, incident to a magneto-optic element which exhibits a multiple domain structure in the state where no magnetic field is applied, the magnetization components in the adjacent domains along the direction in which a light beam travels being different from one another, taking out only zero order diffracted light from the diffracted light that has passed through the magneto-optic element, determining separately, out of the zero order diffraction light, the intensity of light I(ω) of a light component which oscillates at the magnetic field frequency ω of the object of magnetic field measurement and the intensity of light I(2ω) of a light component which oscillates at a frequency twice as high as the light intensity I(ω), and then finding the ratio I(2ω)/I(ω).

DESCRIPTION OF THE PREFERRED EMBODIMENTS

Magneto-optic element for use in the present invention

Figure 7:
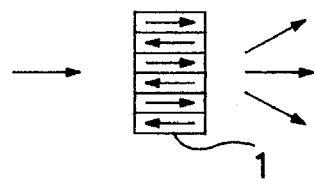
FIG. 7 shows the multiple domain structure of a magneto-optic element for use under the invention.

The magneto-optic element used in the present invention is of a material that exhibits a multiple domain structure when no magnetic field is applied. As FIG. 7 shows, the domains are so arranged that the magnetization vector components in adjacent domains are made alternately antiparallel along the direction of an incident light beam. By way of example, a magnetic garnet material with a large substitution of Bi is usually perpendicularly magnetized and has a multiple domain structure as shown. When a linearly polarized light beam parallel to the direction of magnetization is incident to such a multi-domain structure, the Faraday effect causes the rotation of the planes of polarization. In the domains where the magnetization is parallel to the direction in which the light beam travels, the plane of polarization rotates by $+\Theta_f$, while in the domains of reverse magnetization, the plane rotates by $-\Theta_f$. The difference in angles of rotation of the polarization planes between the domains produces diffraction. Such a multi-domain structure remains in effect where a magnetic field smaller than the saturation magnetic field is applied. Upon incidence of a light beam the multi-domain structure acts as a diffraction grating to diffract part of the incident beam. This means a diffraction loss of the analyzed light. The diffraction loss is at its peak where the applied magnetic field is zero and decreases as the magnetic field increases. Beyond the saturation magnetic field there is no more diffraction because the multi-domain structure of the element changes to a single-domain structure. Theoretically, all the rays of light are diffracted when the Faraday rotation angle of saturation is 90° and the applied magnetic field is zero. An increase in the amount of attenuation is attained by either bringing the angle of rotation close to 90° or arranging in tandem a plurality of magneto-optic elements. Here the intensity of light I of the diffraction order n=zero order due to the diffraction loss, or of the straightly advancing light beam, is expressed by Equation (1) which is an approximate expression that favorably reproduces actually determined values:

$$I=P_o(\cos^2 \Theta_f + (H/H_s)^2 \sin^2 \Theta_f) \quad (1)$$

where $\Theta_f$ is the Faraday rotation angle of saturation, H is an external magnetic field, $H_s$ is the saturation magnetic field, $P_o$ is the intensity of light above the saturation magnetic field, and $|H| \leq H_s$.

When $|H| > H_s$, $I = P_o$. The external magnetic field H can be found by observing the intensity of light I of the zero order diffraction from the magneto-optic element using Equation (1). Conversely, the zero order light intensity I can be attenuated or modulated by adjusting the external magnetic field H.

In Equation (1) the transmissivity depends on the square of the external magnetic field, and therefore the external field cannot be distinguished as positive or negative. Usually, however, a magnetic field sensor and a magnetic field measuring apparatus are used in detecting AC magnetic fields generated by transmission lines, they have only to detect the magnitude of such magnetic fields. Application of a bias magnetic field to a magneto-optic element renders it possible to see whether the external magnetic field is positive or negative.

Figure 1:
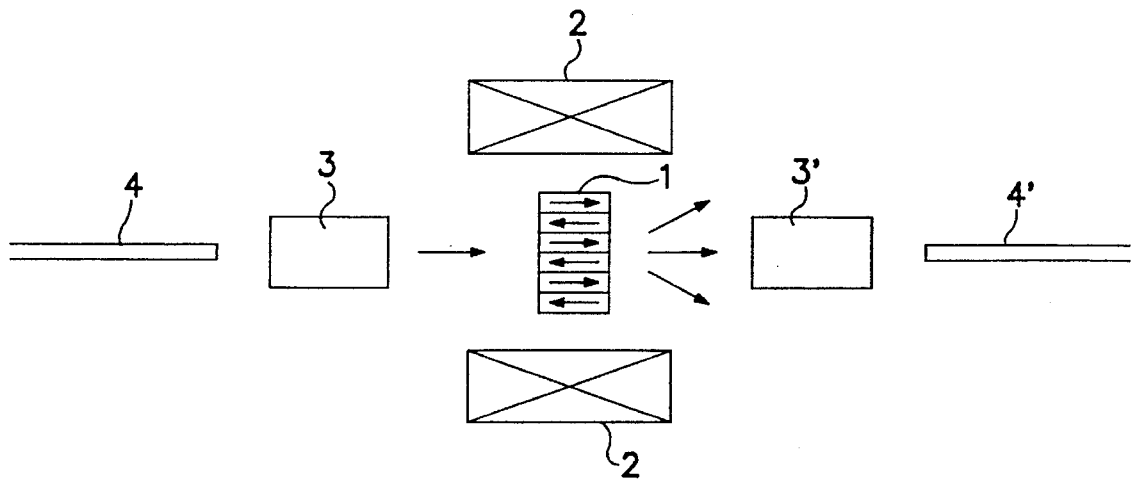
FIG. 1 is an exploded view of an embodiment of the optical attenuator of the present invention.
Figure 2:
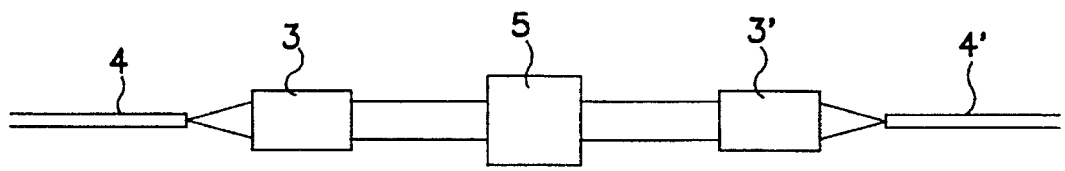
FIG. 2 shows a variable attenuator of the prior art as comprising an attenuator unit of a movable structure and a collimator unit.
Figure 3:
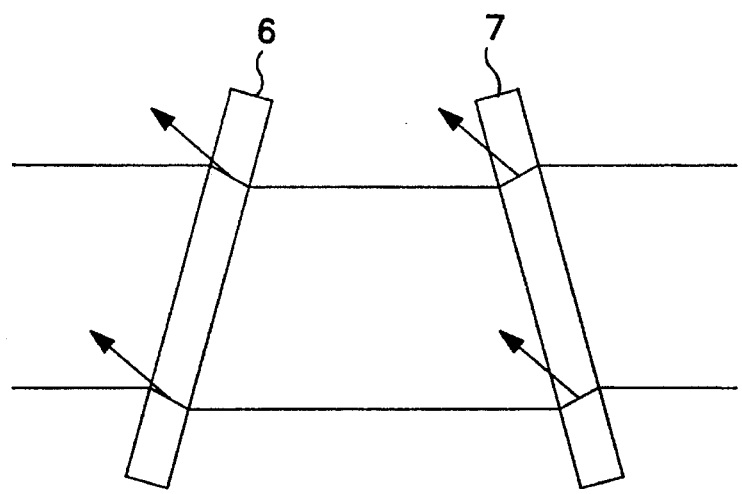
FIG. 3 is an enlarged view of the attenuator part of the conventional optical attenuator.

The disposition of a magneto-optic element with respect to an incident beam of light is desirably such that, as shown in FIG. 1, the directions of magnetization in the adjacent domains are parallel to the incident beam and also antiparallel to one another. Alternatively, the magneto-optic element having perpendicular magnetization may be located at aslant relative to the incident beam. This is because even in the slanted arrangement magnetization components parallel to the incident beam are left behind and the adjacent magnetization components remain opposite to each other. For the purpose of adjusting the amount of optical attenuation or the like, a plurality of magneto-optic elements instead of one may be employed as arranged in tandem. Thus, the present invention adjusts the light intensity directly with diffraction loss by a magneto-optic element and can dispense with an analyzer to a structural advantage.

Figure 5:
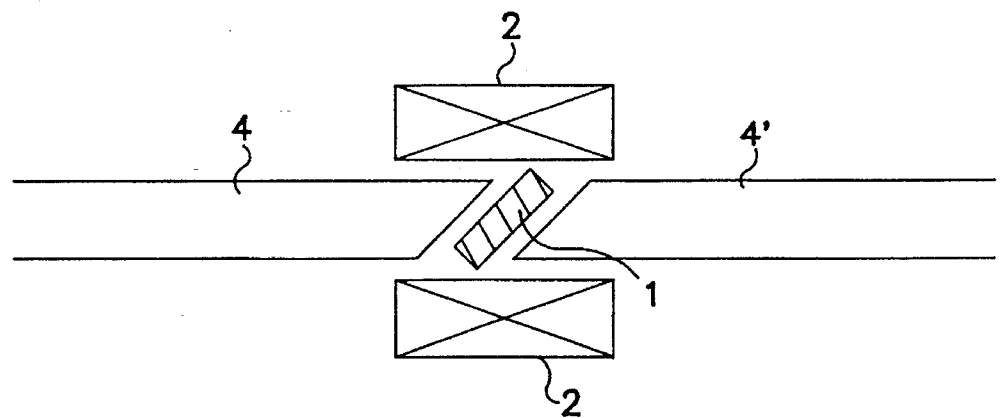
FIG. 5 shows another embodiment of the optical attenuator of the invention wherein the ends of optical fiber and a magneto-optic element disposed therebetween are all slanted.
Figure 6:
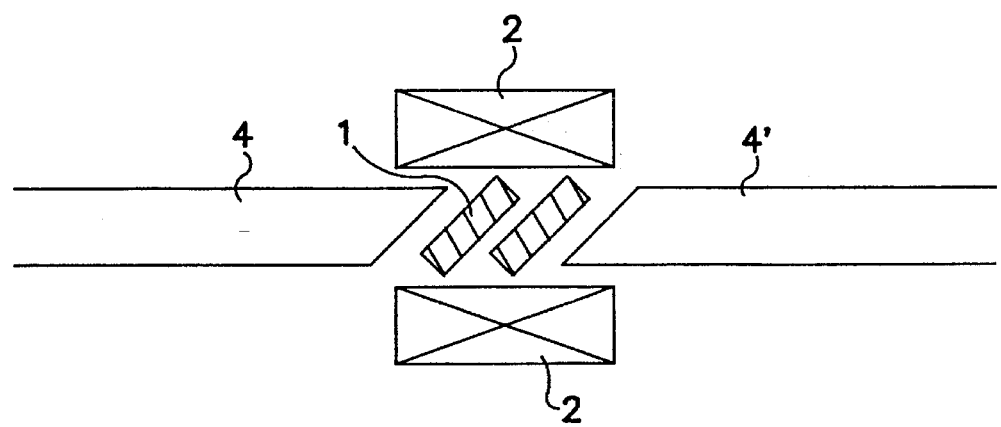
FIG. 6 shows yet another embodiment of the optical attenuator of the invention wherein a plurality of magneto-optic materials are arranged staggeringly in tandem along the optical axis of the attenuator.

The magneto-optic element for use in the present invention is a material which exhibits a multi-domain structure as in FIG. 7 when no magnetic field is applied. It is so located relative to an incident light beam that the magnetization vector components with respect to the direction in which the incident beam travels are different from one another in adjacent domains. The disposition of the magneto-optic element relative to the incident beam is preferably, as illustrated in FIG. 7, such that the directions of magnetization in adjacent domains are parallel to the incident beam and antiparallel to one another. As FIGS. 5 and 6 show, the magneto-optic element or elements themselves that have perpendicular magnetization may be located aslant relative to the incident beam. The slanted disposition is allowed because there are magnetization components parallel to the incident beam and the adjoining magnetization components are directed reverse to one another. It is also possible to use a plurality of magneto-optic elements as arranged in tandem for the adjustment of the amount of optical attenuation or other purposes.

Among the materials that have a multi-domain structure in the absence of a magnetic field are Bi-substituted rare earth iron garnet, rare earth iron garnet, and orthoferrite formed by liquid-phase epitaxial (LPE) growth and other techniques. The materials are not specifically restricted to these, but many other materials may be used which have multi-domain structures that make possible the attainment of the end of the present invention. Such a material, cut so that its easily magnetizable axis is perpendicular to the face, gives generally a thin film of perpendicular magnetization, which may be used as an element according to the invention. Especially an LPE-grown film of Bi-substituted rare earth iron garnet is desirable for the purposes of the invention since, owing to its growth-induced magnetic anisotropy, it is perpendicularly magnetizable in itself without the need of special treatment. Another merit of the Bi-substituted rare earth iron garnet material is a large enough Faraday rotation capacity to obtain a great rotation loss for its thinness. As a light beam passes through such a magneto-optic material, the material acts as a diffraction grating and diffracts a part of the light since the polarization planes for the transmitted light rotate at different angles of Faraday rotation depending on the magnetization components of the respective domains.

Description of optical attenuators and modulators

In FIG. 1 is illustrated an optical system using an optical attenuator embodying the present invention. The optical system comprises a magneto-optic material 1 which exhibits a multi-domain structure when no magnetic field is applied, magnetic field applicator means 2, collimator lenses 3, 3', and optical fibers 4, 4'. In the system shown, the magnetic field applicator means 2 is a movable cylindrically shaped permanent magnet, and the magnetic field applicator means 2 applies a magnetic field parallel to the direction of magnetization of the magneto-optic material 1. The collimator lenses 3, 3' are disposed on both sides of the element 1 along the optical axis of the optical fibers. The lens 3 converts the beam of light emerging from the fiber 4 into parallel rays, and the lens 3' condenses the rays into a beam for the fiber 4'. In such an optical system as shown in FIG. 1, the diffracted rays of light are not received by the light-receiving fiber 4', with the consequence that the light incident to the optical fiber 4' is attenuated. This amount of attenuation, or diffraction loss, is continuously changed by a magnetic field applied to the magneto-optic element 1, as indicated by Equation (1), whereby a variable attenuator is realized.

Figure 8A:
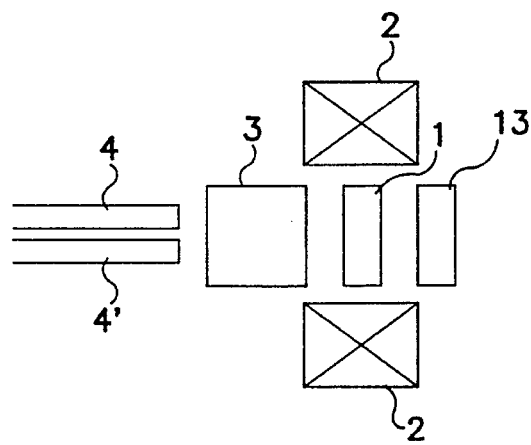
FIGS. 8(a) and 8(b) are exploded views of another embodiment of the optical attenuator of the invention using a reflector film.

Another embodiment of the optical attenuator according to this invention is illustrated in FIG. 8(a). It comprises a magneto-optic element 1, magnetic field applicator means 2, reflector 13, collimator lens 3, and optical fibers 4, 4'. The optical fiber 4 is on the input side, and the beam of light emerging from the optical fiber 4 is converted by the collimator lens 3 into parallel rays of light. The rays pass through the magneto-optic element 1, and are reflected by the reflector 13 to pass the element backward. The rays of light are then led by the collimator lens 3 into the optical fiber 4'. The arrangement is such that only the rays of light from the optical fiber 4 that have not been diffracted by the magneto-optic element 1 are incident to the optical fiber 4'. The scatter of the diffracted rays of light results in attenuation of the light quantity that passes through the optical fiber 4', with the result that the system functions as an optical attenuator. As an alternative, a reflector may be provided on the incidence side of the magneto-optic element so as not to interrupt the incidence of light, in addition to the reflector on the emergence side of the element shown in FIG. 8(a). The reflectors cause the beam of light to be reflected a plurality of times therebetween through the magneto-optic element. The arrangement permits further reduction in the thickness of the element.

The means whereby a magnetic field of variable strength can be applied to the magneto-optic element used in the present invention is not specially limited; it may, for example, be an electromagnet in the case where the amount of optical attenuation is to be electrically controlled or, more conveniently, a permanent magnet in the form of a cylinder or the like shiftable in position. The magnetic field applicator means desirably is located so as to apply a magnetic field in parallel with the magnetization components as depicted in FIG. 1.

The attenuator of the invention is capable of freely and continuously attenuating the intensity of a light beam emerging from a magneto-optic element by properly adjusting the strength of the magnetic field applied by the applicator means disposed as above. The location of the attenuator of the invention with respect to the light source is considered variable as, but not limited to, the locations indicated in the embodiments. As for the input and output means, optical fibers are particularly desirable for the use of the optical attenuator, but again they are not a limitation and many other means may be employed as well.

It is further possible to use the optical attenuator of the invention as an optical modulator by replacing the magnetic field applicator means with a means capable of applying a modulated magnetic field. The optical modulator may instead serve as a variable modulating frequency type by the use of a means capable of applying a magnetic field at a variable modulating frequency.

Description of magnetic field sensors

Figure 9:
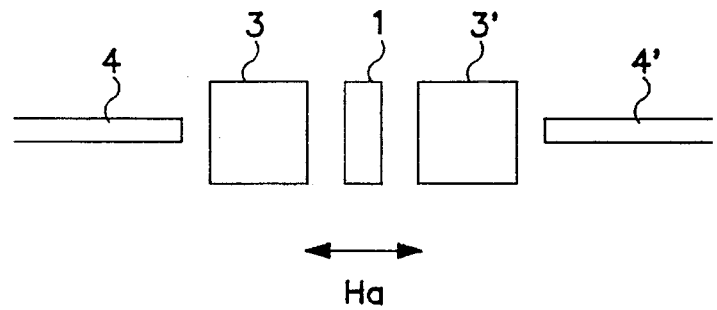
FIG. 9 is an exploded view of one embodiment of the magnetic field sensor of the invention.

An embodiment of the magnetic field sensor according to the invention is shown in FIG. 9. The sensor is made up of a magneto-optic material 1 which exhibits a multi-domain structure when no magnetic field is applied, collimator lenses 3, 3', and optical fibers 4, 4'. An object whose magnetic field is to be measured, such as an electric wire, is indicated at 8. A beam of light emerging from the optical fiber 4 is converted by the collimator lens 3 into parallel rays of light, which then passes through the magneto-optic element 1. Only the rays of light not diffracted by the magneto-optic element 1 are led through the collimator lens 3' into the optical fiber 4'. Thus, from the intensity of light being output from the optical fiber 4' the magnetic field strength of the object 8 can be determined using Equation (1).

Figure 10A:
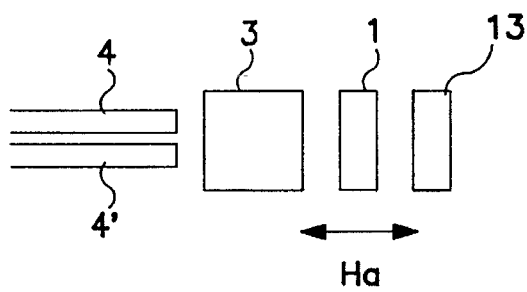
FIGS. 10(a) and 10(b) are an exploded views of another magnetic field sensor of the invention.

As another form of the magnetic field sensor according to this invention, a reflected type magnetic field sensor as shown in FIG. 10(a) can also be used. Shown here is an optical system comprising a magneto-optic element 1, two optical fibers 4, 4' disposed in parallel on one side of the element, and a reflector 13 on the other side. A beam of light emerging from the optical fiber 4 is changed by the collimator lens 3 into parallel rays of light, which pass through the magneto-optic element and then reflected by the reflector 13. The reflected rays of light pass through the magneto-optic element backward and condensed by the collimator lens 3 into a beam for the optical fiber 4'. In this embodiment too, the rays of light diffracted by the magneto-optic element 1 cannot enter the optical fiber 4' and thus constitute a diffraction loss. This embodiment is advantageous in that, since the rays of light pass twice through the magneto-optic element 1, the thickness of the element can be reduced to a half of that in the preceding embodiment. The reflector disposed as shown may be replaced by a reflector film formed directly on the surface of the magneto-optic element by vapor deposition or other technique. As a further modification, two or more reflectors may be disposed around the magnetic field sensor to allow the beam of light to pass three or more times through the magneto-optic element, whereby an even thinner magneto-optic element can be used. Input and output means for the optical signals may be so provided that the directions of incidence and emergence of optical signals are not parallel to each other. As for the magneto-optic element to be used in the magnetic field sensor according to the invention, the element may be located aslant along the optical axis or instead a plurality of elements may be arranged as arranged in tandem along the direction in which the light beam travels.

Apparatus and method for magnetic field measurement

Figure 13:
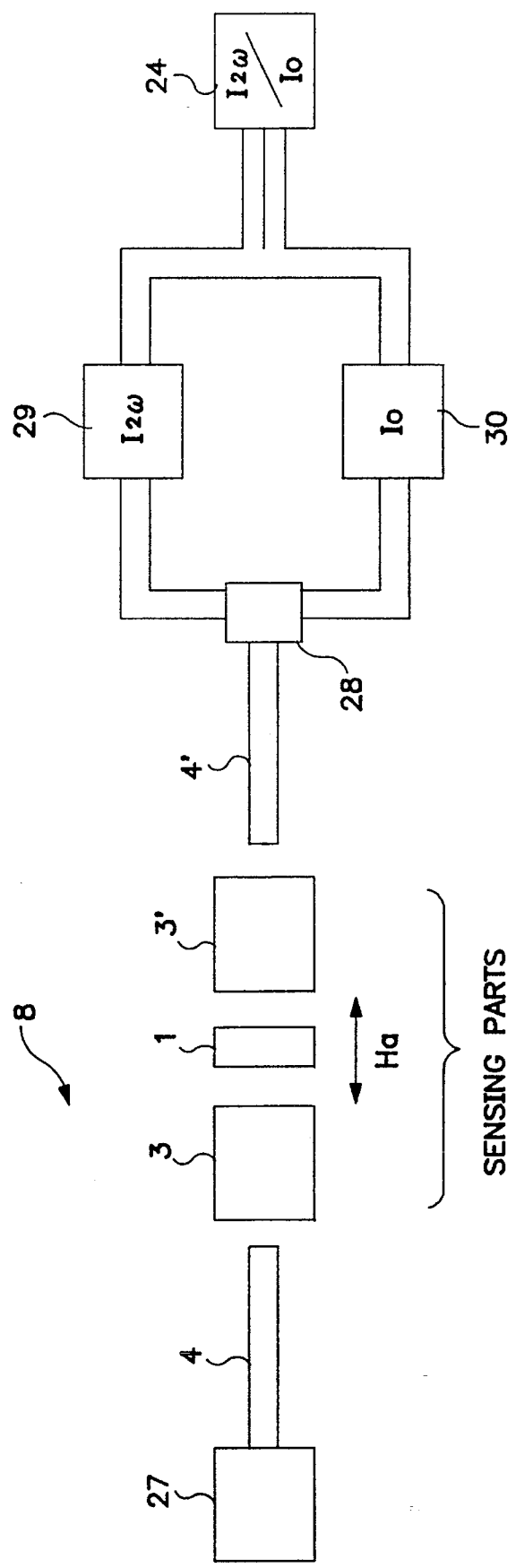
FIG. 13 is a schematic view of an embodiment of the magnetic field measuring apparatus of the invention.

An embodiment of the magnetic field measuring apparatus of the present invention equipped with a magnetic field sensor of the invention is illustrated in FIG. 13. It comprises a magneto-optic element 1, light source 27 for light incidence to the element, collimator lenses 3, 3', photo-detector means 28 for receiving the zero order diffracted rays of light and converting them into electric signals, means 29 for measuring the light intensity I(2ω) of the light component which oscillates at a frequency twice as high as the magnetic field frequency ω of the object of measurement, means 30 for finding the light intensity Io of a light component corresponding to the DC component of the zero order diffracted light, and means 24 for finding the ratio I(2ω)/Io. Convenient as the means 29 is that which measures the light intensity I(2ω) of the light component vibrating at the frequency twice greater than the magnetic field frequency ω in terms of an electric signal intensity I'(2ω) via the photo-detector means 28. Likewise convenient as the means 30 is that which measures the light intensity Io of the light component corresponding to the DC component of the zero order diffracted light in terms of an electric signal intensity I' via the photo-detector means 28. Indicated at 4, 4' are optical fibers. In order to take out only the zero order diffracted light, it is only necessary to make an arrangement lest the diffracted light of the nω0 order be incident to the optical fiber 4'. The end is attained, e.g., by using single-mode fibers as the optical fibers 4, 4' and providing a parallel beam optical system with the aid of the collimator lenses 3, 3'. The light source is, e.g., a laser or LED, but this is not a limitation, and many different light sources may be chosen instead. As for the means 24 for finding the ratio I(2ω)/Io, e.g., a division circuit may be used.

The sensing parts 3, 1, 3' are installed in the vicinity of an object whose magnetic field is to be measured, e.g., an electric cable 8, and the magnetic field is measured in the following way. First, a light beam from the light source 27 is introduced into the magneto-optic element 1 via the optical fiber 4 and the collimator lens 3. Out of the diffracted rays of light that have passed the magneto-optic element, only the zero order diffracted light is taken out through the collimator lens 3' into the optical fiber 4' and then is converted by the photo-detector means to electric signals. Next, out of the electric signals, the intensity I(2ω) of the component of the frequency twice as high as the magnetic field frequency ω of the object and the intensity Io corresponding to the DC component are observed, respectively, as electric signals input to frequency component detectors 29 and 30. From these signals a divider 24 calculates their ratio k=I(2ω)/Io and Hω represented by Equation (2)

$$H\omega = (H_s/\tan\Theta_f) \cdot \sqrt{\{2k/(1-k)\}} \tag{2}$$

where Hω is the magnetic field strength of the object of measurement, $H_s$ is the saturation magnetic field of the magneto-optic element, and $\Theta_f$ is the saturation Faraday rotation angle.

The following shows how the magnetic field strength Hω of the object is derived from the calculation of k by Equation (2).

The magnetic field H of the magneto-optic element produced by the current of a transmission line or the like as the object of measurement is expressed as $$H = H\omega \sin \omega t \tag{3}$$

where $\omega$ is the frequency of the AC electric field of the transmission line and $H\omega$ is the amplitude of the magnetic field.

Rearranging by substitution of Equation (3) into Equation (1) gives the following equation:

$$I = I_o - I(2\omega) \cos 2\omega t \quad (6)$$

where $$I_o = P_o(\cos^2 \Theta_f + (H\omega^2/2H_s^2) \sin^2 \Theta_f)$$

and $$I(2\omega) = P_o(H\omega^2/2H_s^2) \sin^2 \Theta_f$$

Let $k = I(2\omega)/I_o$, and $H\omega$ is found by Equation (2).

$$H\omega = (H_s/\tan \Theta_f) \cdot \sqrt{\{2k/(1-k)\}} \quad (2)$$

Equation (2) is simplified, when $k \ll 1$, to be $H\omega \approx (H_s/\tan \Theta_f)\sqrt{(2k)}$. Here, if $H\omega$ is to be measured stably independently of temperature, it is only necessary to reduce the temperature dependence of $(Hs/\tan\Theta_f)$. Let the temperature be T, and then we obtain:

$$\frac{1}{(Hs/\tan\theta_f)} \frac{d}{dT}\left(\frac{Hs}{\tan\theta_f}\right) = \frac{1}{Hs}\frac{dHs}{dT} - \frac{2\theta_f}{\sin 2\theta_f} \frac{1}{\theta_f}\frac{d\theta_f}{dT} \quad (8)$$

$$\frac{2\theta_f}{\sin 2\theta_f}$$

is, when $\Theta_f = 0$, $$\frac{2\theta_f}{\sin 2\theta_f} = 1$$

and increases monotonically with $\Theta_f$ and, when $\Theta_f = \pi/2$, it becomes $$\frac{2\theta_f}{\sin 2\theta_f} \to \infty.$$

For example, with a magneto-optic element of the composition $Bi_{1.5}Y_{1.5}Fe_5O_{12}$, $$\frac{1}{Hs}\frac{dHs}{dT} = -0.18\%/°C.$$

$$\frac{1}{\theta_f}\frac{d\theta_f}{dT} = -0.14\%/°C.$$

and when $\Theta_f = 0.19\pi(\text{rad}) = 34$ deg, $$\frac{1}{(Hs/\tan\theta_f)} \frac{d}{dT}\left(\frac{Hs}{\tan\theta_f}\right) = 0.$$

Thus, proper adjustments of the material composition and Faraday rotation angle $\Theta_f$ (i.e., the thickness) permit the magneto-optic element to become independent of the ambient temperature.

The method and apparatus of the invention do not require a polarizer or analyzer as compared with those of the prior art. The temperature dependence of the apparatus can be eliminated without the application of a bias magnetic field as taught by Patent Application Public Disclosure No. 1-223359.

Accordingly, magnetic field measurement is made easier and the apparatus itself can be further simplified.

Figure 15:
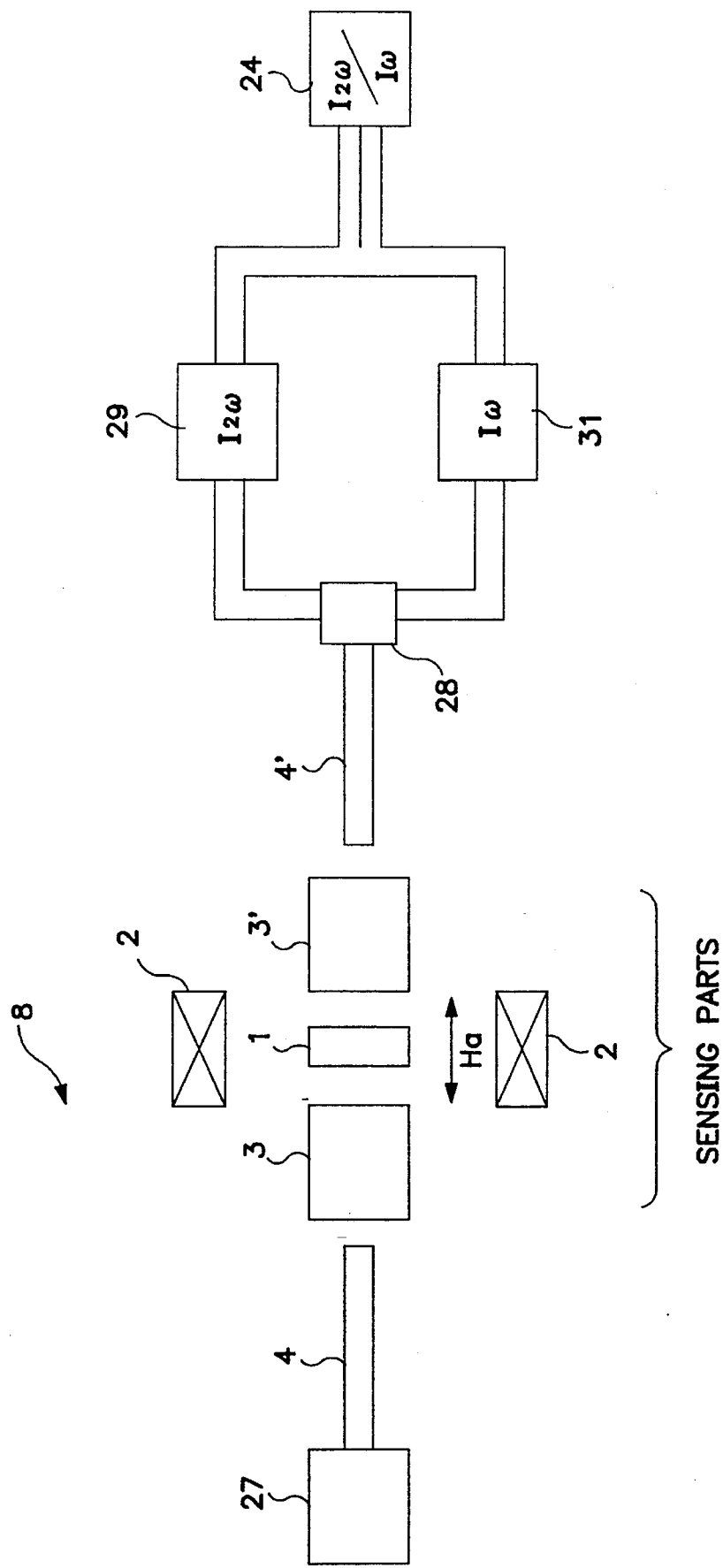
FIG. 15 is an exploded view of an embodiment of the magnetic field measuring apparatus wherein a bias magnetic field is applied in accordance with the invention.

Another embodiment of the magnetic field measuring apparatus according to the invention is shown in FIG. 15. The apparatus is the same as that shown in FIG. 13 except that it includes a magnetic field applicator means 2 located around and in parallel with the magneto-optic element 1, a means 31 for finding $I(\omega)$ in place of Io in the apparatus of FIG. 13, and a means for finding the ratio $I(2\omega)/I(\omega)$ in place of the means for calculating the ratio $I(2\omega)/Io$. The magnetic field applicator means to be used here may be any of the various means as used with the optical attenuators. The device for measuring $I(\omega)$ may, e.g., be a frequency component detector as for the measurement of $I(2\omega)$, and the device for calculating the ratio $I(2\omega)/I(\omega)$ may, e.g., be a divider.

The sensing parts 1, 3, 3', 2 as shown in FIG. 15 are disposed in the neighborhood of an object, an electric cable 8, for magnetic field measurement. The measuring method is basically the same as with the apparatus of FIG. 13, but in this case the zero order diffracted light from the magneto-optic element is observed while the magnetic field applicator means is applying a given magnetic field to the element. As regards the components of diffracted light to be observed here, the intensity of the light component which oscillates at the frequency $\omega$ of the electric current of the transmission line as an object of measurement and the intensity of the light component which oscillates at a frequency $2\omega$ twice as high as the $\omega$, i.e., $I(\omega)$ and $I(2\omega)$, respectively, are determined. Thus, the magnetic field strength $H\omega$ of the transmission line can be calculated using Equation (5):

$$H\omega = (4I(2\omega)/I(\omega))Hb \quad (5)$$

where Hb is the strength of bias magnetic field.

The principle of calculation of the magnetic field $H\omega$ from Equation (5) will now be explained. In this case the bias magnetic field is applied to the magneto-optic element independently of the magnetic field from the object of magnetic field measurement. Consequently, the total of the magnetic fields to which the magneto-optic element is subjected is:

$$H = Hb + H\omega \sin \omega t$$

Substituting this magnetic field H for Equation (1) where the zero order diffraction light intensity is found, gives Equation (4):

$$I = I_o + I(\omega) \sin \omega t - I(2\omega) \cos 2\omega t \quad (4)$$

where $$I_o = P_o(\cos^2 \Theta_f + \{(Hb^2 + H\omega^2/2)/H_s^2\} \sin^2 \Theta_f$$

$$I(\omega) = P_o(2HbH\omega/H_s^2) \sin^2 \Theta_f$$

$$I(2\omega) = P_o(H\omega^2/2H_s^2) \sin^2 \Theta_f$$

Here the ratio of $I(\omega)$ to $I(2\omega)$ is calculated to be $I(\omega)/I(2\omega) = 4Hb/H\omega$, and Equation (5) is found.

As stated above, $H\omega$ can be found from $I(2\omega)/I(\omega)$ and Hb, and because Equation (5) does not include $\Theta_f$ and Hs, $H\omega$ can be stably determined utterly independently of the temperature characteristics of the magneto-optic element. The temperature dependence of Hb itself should be kept low enough, however. The measurable range of the magnetic field $H\omega$ is $H\omega < Hs - Hb$.

Figure 11:
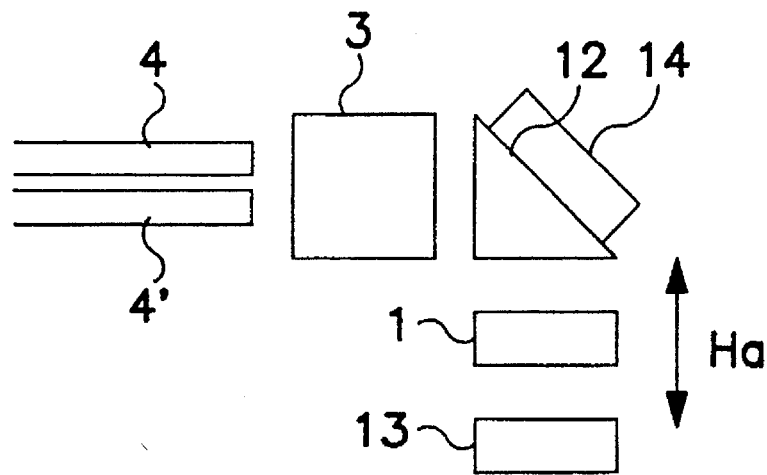
FIG. 11 is an exploded view of a magnetic field sensor incorporating a prism in accordance with the invention.

While the magnetic field measuring apparatus and method have thus far been described in connection with FIGS. 13 and 15, the arrangements of the magneto-optic element, light source and photo detector means, etc. are not restricted to those illustrated there but many other arrangements are employable. As indicated, by way of example, in the explanation of the magnetic field sensor according to the invention, various modifications may be used. For example, a mirror may be located at one end of the magneto-optic element, in intimate contact with or in spaced relation to the latter, so that the incident light can be reflected back to the direction of incidence. Another possible arrangement, as shown in FIG. 13, uses a glass prism 12 equipped with a reflector and installed in the analyzing part of a magnetic field measuring apparatus. Turning to FIG. 11, a beam of light incident from an optical fiber 4 is made into parallel rays by a collimator lens 3, reflected by a reflector film affixed to a prism 12 into a magneto-optic element 1, and then, past the element, turned backward by a reflector 14. The reflected rays of light pass approximately the same route to be condensed by the collimator lens 3 into another optical fiber 4'.

The invention is illustrated by the following examples, which are not limitative.

EXAMPLES

Example 1

(An embodiment of the optical attenuator of the invention)

In an optical attenuator shown in FIG. 1, an LPE-grown film of the composition $Bi_{1.4}Y_{1.6}Fe_5O_{12}$ was used as the magneto-optic material 1. The film had perpendicular magnetizability and was 400 μm thick. In this system the diffraction loss produced by the magneto-optic material 1 decreased and the incidence of light to the optical fiber 4' increased as the magnetic field strength was gradually increased from zero. The optical attenuator loss in the absence of a magnetic field was 12 dB. The loss gradually decreased as the magnetic field was increasingly applied. The loss reached 2 dB under a magnetic field of about 1.5 kOe. No more change was observed beyond 2 dB despite the application of a greater magnetic field.

Example 2

(Another embodiment of the optical attenuator of the invention)

Figure 4:
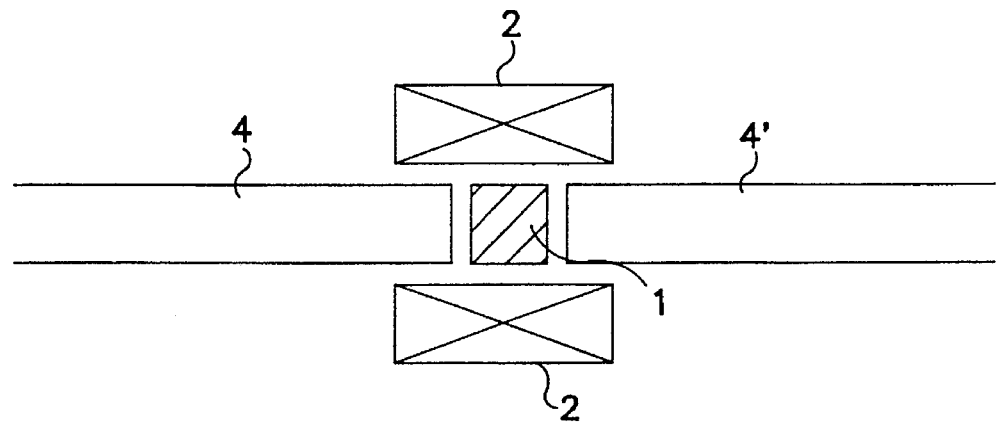
FIG. 4 shows another embodiment of the optical attenuator of the invention wherein a magneto-optic material is directly inserted between two optical fibers.

FIG. 4 shows an optical system as another embodiment of the optical attenuator of the invention. A magneto-optic material 1 is inserted directly between the ends of two optical fibers and no collimator lens is used, but otherwise the construction is the same as that of the optical system in Example 1. This arrangement, suitable for a system which does not essentially require a collimator lens, permits simplification of construction.

Example 3

(Another embodiment of the optical attenuator of the invention)

FIG. 5 shows the arrangement of an optical system which is similar to the embodiment of FIG. 4 but the opposing ends of two optical fibers and the magneto-optic element inserted in between are all slanted. The advantage of this embodiment is that it can prevent unwanted backward reflection of light from fiber ends.

Example 4

(Yet another embodiment of the optical attenuator of the invention)

FIG. 6 shows the arrangement of FIG. 5 modified with the disposition of a plurality of magneto-optic members in tandem. This modification is desirable where an even larger amount of attenuation is required.

Example 5

(Still another embodiment of the optical attenuator of the invention)

Figure 8B:
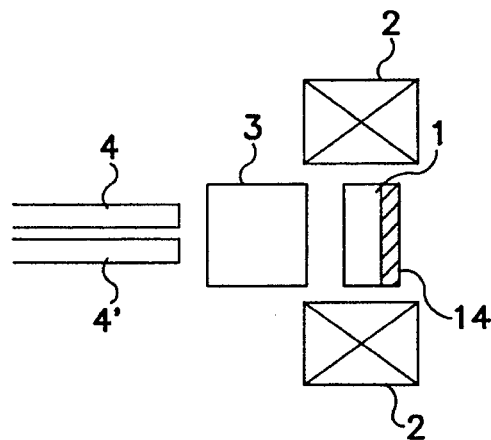

FIG. 8(b) shows still another embodiment of the optical attenuator of the invention. The optical layout of this attenuator is the same as that in FIG. 8(a) with the exception that the reflector 13 was formed by vapor deposition of Al on the light transmitted or emerging side of the magneto-optic element rather than as a separate piece as in FIG. 8(a). An LPE-grown film of $Bi_{1.4}Y_{1.6}Fe_5O_{12}$ was used as the magneto-optic element 1. The film had perpendicular magnetizability and the element thickness was 200 μm. Magnetic field applicator means 2 was a movable, cylindrically shaped permanent magnet, which applied a magnetic field parallel to the direction of magnetization of the magneto-optic element 1. In this optical attenuator a laser beam with a wavelength of 1.3 μm was introduced through the optical fiber 4 and the quantity of light leaving the optical fiber 4' was measured. The diffraction loss from the magneto-optic element 1 decreased and the quantity of light incident from the optical fiber 4 to the fiber 4' increased as the magnetic field strength was gradually changed from zero upward. The optical attenuator loss in the absence of a magnetic field was 12 dB. With gradual application of a magnetic field the loss decreased correspondingly, down to 1 dB under a magnetic field of about 1.5 kOe. It was found that no more magnetic field applied would cause any change in loss from the 1 dB level.

Example 6

(An embodiment of the magnetic field measuring apparatus of the invention)

Figure 14:
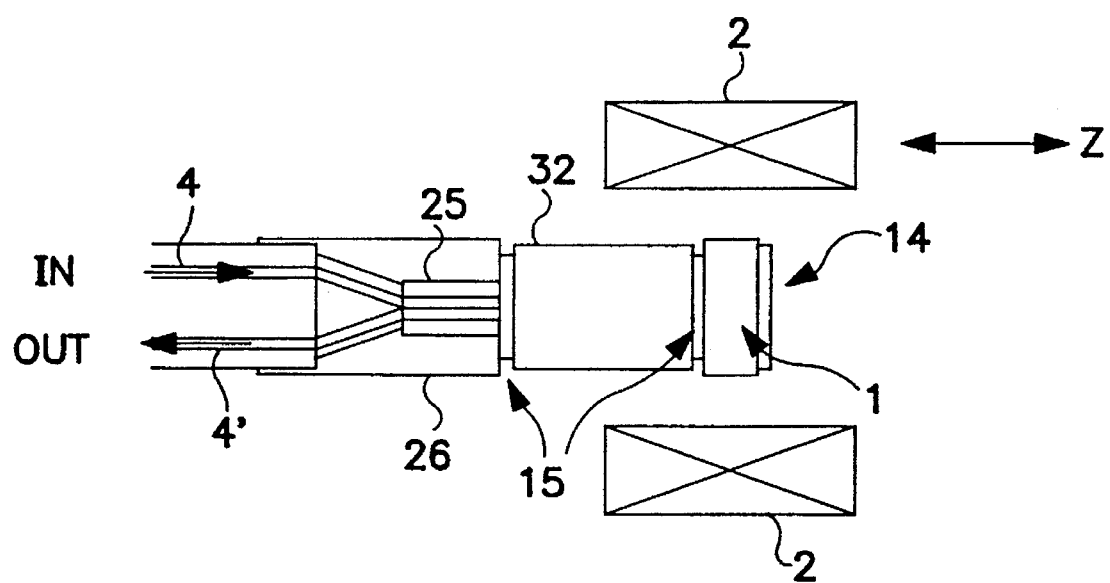
FIG. 14 shows the sensor unit of a magnetic field measuring apparatus used in examples of the invention.
Figure 16:
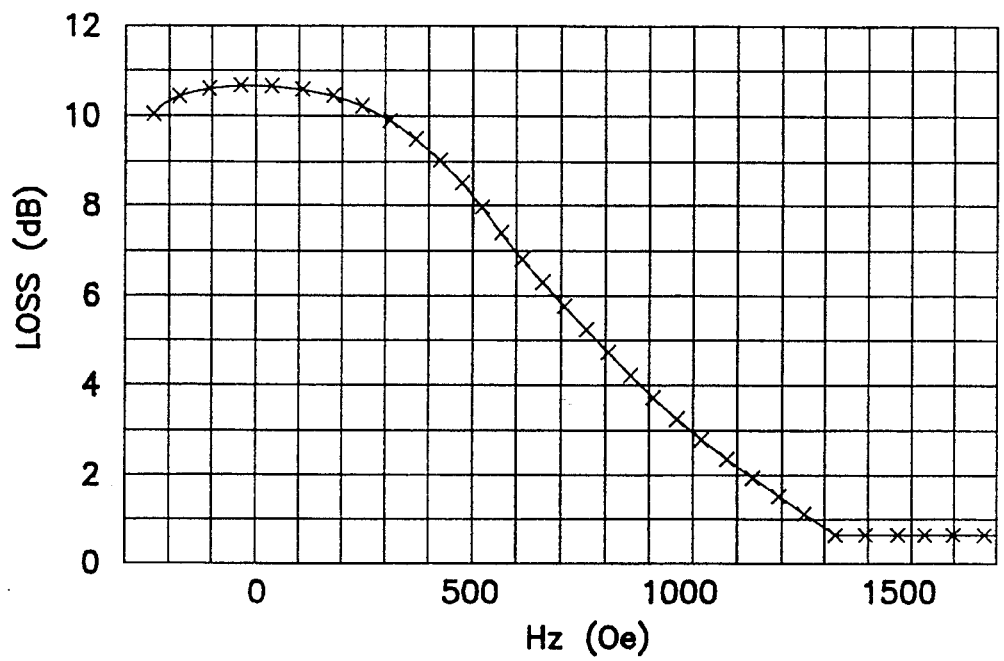
FIG. 16 is a graph demonstrating that an optical attenuator embodying the invention is capable of changing the amount of attenuation continuously depending upon an applied magnetic field.
Figure 17:
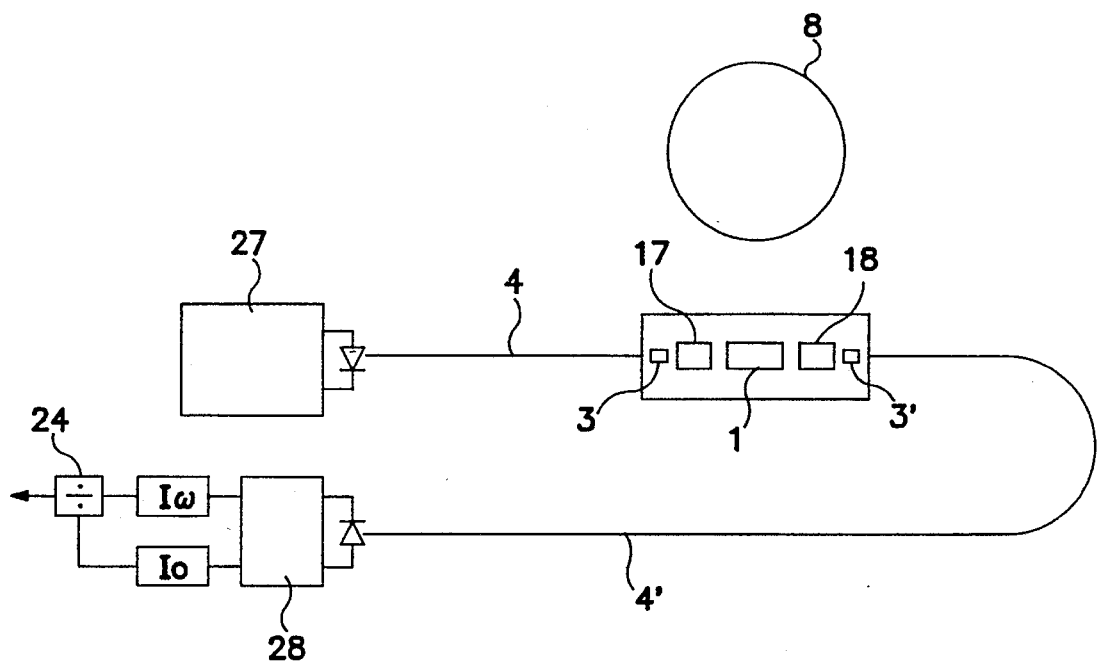
FIG. 17 is a schematic view illustrating the arrangement of a polarizer, analyzer, and Faraday rotor in a conventional magnetic field sensor.

A magnetic field measuring apparatus as shown in FIG. 14 was built in conformity with the invention. The apparatus used as its magneto-optic element 1 an optical element of the composition $(BiHoTb)_3Fe_5O_{12}$ in the form of a 350 μm-thick LPE-grown film. A reflector film 14 was formed by vapor deposition on one end of the element, and a lens 32 was attached to the other end of the element via an adhesive layer 15 of an ultraviolet-curing resin. To the opposite end of the lens 32 were secured optical fibers 4, 4' for light incidence and emergence, respectively, supported by a glass tube 25. The glass tube and optical fiber portions 4, 4' were enclosed altogether in a sleeve 26 of stainless steel (SUS) as shown. A coil 2 as a magnetic field applicator means was so located as to surround the periphery of the magneto-optic element 1. With the optical attenuator thus embodying the invention, an experiment was conducted to prove its possibility of continuously decreasing the amount of light attenuation with the application of a magnetic field. A LED light having a wavelength of 1.3 μm was used as a light source and a photodiode as a light-receiving element, and a continuously changing magnetic field was applied to the coil. The results are graphically represented in FIG. 16. The graph indicates that the amount of attenuation, starting with 10.5 dB with zero magnetic field, decreases continuously as the magnetic field increases until it reaches a constant value of 0.8 dB with a saturation magnetic field of 1300 Oe.

Example 7

(An embodiment of the magnetic field sensor of the invention)

A magnetic field sensor embodying the invention as shown in FIG. 9 was made. As a magneto-optic element 1 of this magnetic field sensor, an LPE-grown film of $Bi_{1.4}Y_{1.6}Fe_5O_{12}$ was used. The film had perpendicular magnetizability and the element thickness was 400 μm. In this optical system, a laser beam having a wavelength λ=1.3 μm was introduced through an optical fiber 4. The strength of a magnetic field externally applied for the testing purposes was increased gradually from zero, and it was confirmed that the diffraction loss from the magneto-optic element 1 decreased and the quantity of light incident to another optical fiber 4' increased. When no magnetic field was applied the transmission loss was 12 dB. Gradual application of the magnetic field caused a gradual decrease in the loss, down to 1 dB under a magnetic field of about 1.5 kOe. It was found also that the loss remains unchanged at 1 dB with any further magnetic field application. The experiment revealed that the optical system using the above-described magneto-optic element functions as a magnetic field sensor.

Example 8

(Another embodiment of the magnetic field sensor of the invention)

Figure 10B:
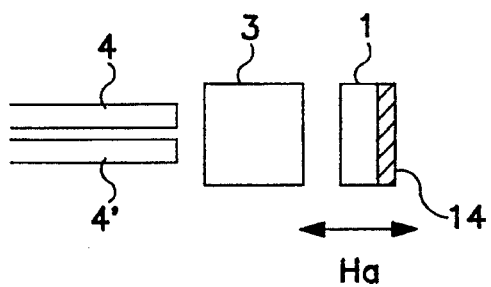

A magnetic field sensor of the invention as shown schematically in FIG. 10(b) was made. The sensor used a magneto-optic element of the same material as referred to in Example 7, the element being 200 μm thick. The optical arrangement was the same as that of the sensor shown in FIG. 10(a) except that the reflector 13 was an Al film formed by vapor deposition on the surface of the magneto-optic element 1. In order to provide a structure equivalent to that of FIG. 14 with the exclusion of the magnetic field applicator means 2, the components were integrally assembled, using the glass tubes and stainless steel (SUS) sleeve, with an ultraviolet-curing resin as the adhesive. With this arrangement the transmission loss without the application of a magnetic field for testing use was 12 dB. With gradual application of the magnetic field the loss decreased accordingly. Under the magnetic field of about 1.5 kOe the loss was 1 dB. The loss was found unchanged at this level upon further addition of the magnetic field.

Example 9

(Another embodiment of the magnetic field sensor of the invention)

Shown in FIG. 11 is a modification of the optical system of Example 8 with the addition of a glass prism 12 provided with a reflector film. In this optical system the light beam from the optical fiber 4 is converted by the collimator lens 3 into parallel rays of light, which are reflected at a right angle by the reflector film 14 into the magneto-optic element and, past the element, cast back by the reflector 13. The reflected rays of light pass substantially the same light path and are condensed by the collimator lens 3 into the optical fiber 4'. The diffracted rays of light are not condensed into the optical fiber in the same way as described in the example referred to above. The detectable magnetic field direction differs 90° from that indicated in FIG. 10. This arrangement is advantageous where the optical fibers extend along a transmission line and the magnetic field to be measured is at right angles to the direction in which the fibers extend.

Example 10

(Yet another embodiment of the magnetic field sensor of the invention)

Figure 12:
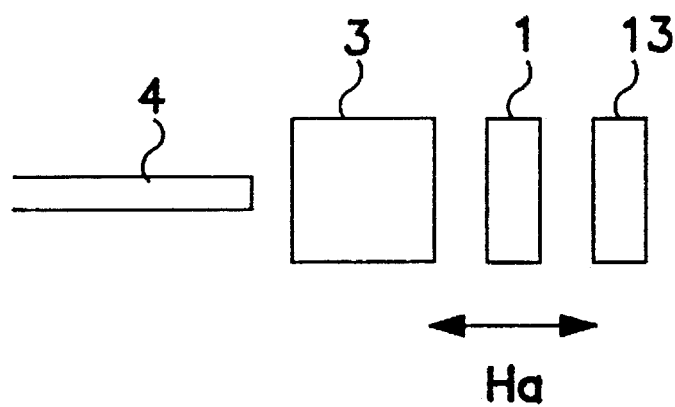
FIG. 12 is an exploded view of a magnetic field sensor in which a single length of optical fiber is used in accordance with the invention.

FIG. 12 shows another modification of the sensor of the invention, using a single optical fiber instead of the two in FIG. 10. The light beam emerging from the optical fiber 4 is diffracted by the magneto-optic element 1, and all but the diffracted light enters the fiber 4 again. This embodiment, which uses only one optical fiber, simplifies the sensor structure, although a light brancher must be located on the light emitting-receiving sides so that the returning light can be received by a receiving unit.

Example 11

(An embodiment of the magnetic field measuring apparatus of the invention)

Figure 18:
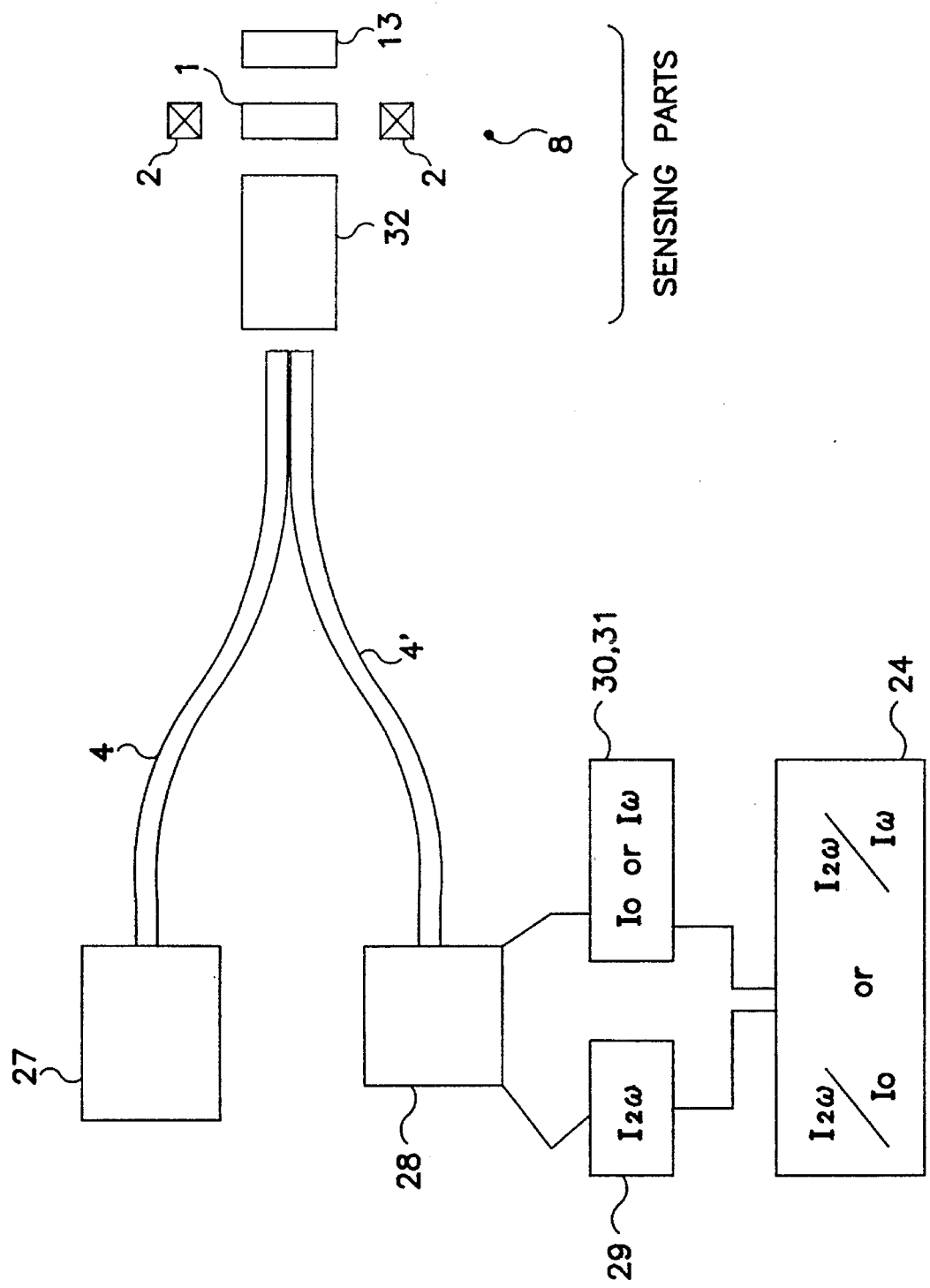
FIG. 18 is a schematic view of a magnetic field measuring apparatus used in examples of the present invention.

A magnetic field measuring apparatus of the invention incorporating the magnetic sensor made in Example 8 is shown in FIG. 18. The apparatus used an optical element of an 80 μm-thick LPE-grown film of $Bi_{1.5}Y_{1.5}Fe_5O_{12}$ as the magneto-optic element 1. An LED having a wavelength of 1.3 μm was used as a light source 27, and a photodiode 28 as a light-receiving element. The intensities of light I(ω) and I(2ω) with the frequencies ω, 2ω of the object whose magnetic field is to be measured and the intensity corresponding to the DC component, respectively, were observed using frequency component detectors 31, 29, and 30. A coil was held around the magneto-optic element as a means 2 for applying a magnetic field to the element.

(1) Magnetic field measurement in the absence of a bias magnetic field

An external magnetic field of 50 Hz was applied by a magnetic field applicator means 2 to the apparatus shown in FIG. 18, and the light intensities I(2ω) and Io and then k=I(2ω)/Io were determined. When the external magnetic field was small, the magnetic field strength was found from the relation (2) between the amplitude of the external magnetic field, Hω, and k as follows:

$$Hω(Oe)=3150×\sqrt{-k}$$

This relation was found almost unchangeable with the fluctuation of ambient temperature.

(2) Magnetic field measurement in the presence of a bias magnetic field

Using a permanent magnet, a constant magnetic field of 500 (Oe) as a bias magnetic field was kept applied to the above apparatus. Then, in the same way as in (1) above, an external magnetic field of 50 Hz was applied by the magnetic field applicator means. The I(2ω), I(ω), and their ratio I(2ω)/I(ω) were measured, and from the relation (5) the equation $$Hω(Oe)=2000×I(2ω)/I(ω)$$

was derived. Thus it was confirmed that the external magnetic field strength Hω can easily be found in this way.

The optical attenuators according to the present invention are extremely simple in construction and capable of adjusting the amount of attenuation easily and continuously by changing an externally applied magnetic field. Because their optical systems include no moving part, the apparatus reliability is high.

The optical attenuators of the type equipped with a reflector permit a light beam to pass twice through the magneto-optic element. Consequently, the element may be a half as thick as that designed for a single pass. This combines with the necessity of only one collimator lens in place of two for the single-pass optical system to reduce the overall dimensions of the attenuator to a very small size.

The magnetic field sensors and measuring apparatuses of the invention, which do not use a polarizer or analyzer, are simple in construction, reducible in size, and easy to manufacture. The omission of both polarizer and analyzer makes possible stable measurement without a change in the quantity of light independently of the variation of the polarization plane of light that propagates through the optical fibers. Also, because the light quantity ratios such as $I(2\omega)/I(\omega)$ and $I(2\omega)/Io$ also are measured, stable measurement is ensured despite changes in the quantity of light propagating through the optical fibers or in the ambient temperature due to environmental changes. The primary magnetic field measuring apparatus of the invention can achieve temperature stability without the need of a bias magnetic field, and therefore is even more simplified in construction and makes the measuring method easier too.

While preferred embodiments of the invention have been described in detail, many variations and modifications thereof will occur to those skilled in the art within the scope of the appended claims. For example, the optical fibers, magnetic field applicator means, lenses, prisms, reflectors, and all other optical elements for use in the present invention are not limited to those described herein but may be chosen from among many other types available, and their optical arrangement may also be varied, all those changes and variations falling within the scope of the following claims.

What is claimed is:

1. A magnetic field sensor for detecting a magnetic field in which the sensor is placed, comprising a magneto-optic element which exhibits a multiple domain structure in a state where no magnetic field is applied, wherein magnetization components in adjacent domains of the element along a direction in which a light beam travels are different from one another, the light beam being diffracted by the magneto-optic element, said magneto-optic element being a Bi-substituted rare earth iron garnet film formed by liquid-phase epitaxial (LPE) growth, and a reflector provided on one side of said magneto-optic element, said reflector being provided on a surface of said magneto-optic element.

2. A magnetic field sensor for detecting a magnetic field in which the sensor is placed, comprising a magneto-optic element which exhibits a multiple domain structure in a state where no magnetic field is applied, wherein magnetization components in adjacent domains of the element along a direction in which a light beam travels are different from one another, the light beam being diffracted by the magneto-optic element, and a reflector provided on one side of said magneto-optic element, said reflector being a reflector film formed on a surface of said magneto-optic element, two optical fibers being arranged in parallel to each other and being located on one side of said magneto-optic element, said two optical fibers corresponding to the input and output means, the reflector being located on an opposite side of said element.

3. A magnetic field sensor for detecting a magnetic field in which the sensor is placed, comprising a magneto-optic element which exhibits a multiple domain structure in a state where no magnetic field is applied, wherein magnetization components in adjacent domains of the element along a direction in which a light beam travels are different from one another, the light beam being diffracted by the magneto-optic element, and a reflector provided on one side of said magneto-optic element, said reflector being a reflector film formed on a surface of said magneto-optic element.

4. A magnetic field sensor according to claim 1 wherein said magneto-optic element comprises a plurality of magneto-optic elements arranged in tandem along the direction in which the light beam travels.

5. A magnetic field measuring apparatus comprising a magneto-optic element which exhibits a multiple domain structure in the state where no magnetic field is applied, the magnetization components in the adjacent domains along the direction in which a light beam travels being different from one another, said magneto-optic element being a Bi-substituted rare earth iron garnet film formed by liquid phase epitaxial (LPE) growth, means for applying a magnetic field of variable strength to said magnetor-optic element, optical fiber input means and optical fiber output means for optical signals, and a reflector provided on one side of said magneto-optic element, said reflector being provided on a surface of said magneto-optic element; emitter means for directing a light beam incident to the surface of the element; means for finding the intensity of light $I(2\omega)$ of a light component, out of zero order diffraction light that has passed through the magneto-optic element, which oscillates at a frequency twice as high as the magnetic field frequency $\omega$ of the object of magnetic field measurement; means for finding the intensity of light Io of a light component corresponding to the DC component of the zero order diffraction light; and means for finding the ratio $I(2\omega)/Io$.

6. A magnetic field measuring apparatus comprising a magneto-optic element which exhibits a multiple domain structure in the state where no magnetic field is applied, the magnetization components in the adjacent domains along the direction in which a light beam travels being different from one another, said magneto-optic element being a Bi-substituted rare earth iron garnet film formed by liquid-phase epitaxial (LPE) growth, means for appling a magnetic field of variable strength to said magneto-optic element, optical fiber input means and optical fiber output means for optical signals, and a reflector provided on one side of said magneto-optic element, said reflector being provided on a surface of said magneto-optic element; emitter means for directing a light beam incident to the surface of the element; a magnetic field applicator means for applying a constant bias magnetic field to said magneto-optic element; means for finding the intensity of light $I(\omega)$ of a light component, out of zero order diffraction light that has passed through the magneto-optic element, which oscillates at the magnetic field frequency $\omega$ of the object of magnetic field measurement; means for finding the intensity of light $I(2\omega)$ of a light component which oscillates at a frequency twice as high as the light intensity $I(\omega)$; and means for finding the ratio $I(2\omega)/I(\omega)$.

7. A method of measuring the magnetic field of an object which generates a magnetic field to be measured, which process comprises directing a light beam, in the vicinity of the object, incident to a magneto-optic element which exhibits a multiple domain structure in the state where no magnetic field is is applied, the magnetization components in the adjacent domains along the direction in which a light beam travels being different from one another, said magneto-optic element being a Bi-substituted rare earth iron garnet film formed by liquid phase epitaxial (LPE) growth, means for applying a magnetic field of variable strength to said magneto-optic element, optical fiber input means and optical fiber output means for optical signals, and a reflector provided on one side of said magneto-optic element, said reflector being provided on a surface of said magneto-optic element; taking out only zero order diffracted light from diffracted light that has passed through said magneto-optic element, determining separately, out of the zero order diffraction light, the intensity of light $I(2\omega)$ of a light component which oscillates at a frequency twice as high as the magnetic field frequency $\omega$ of the object of magnetic field measurement and the intensity of light Io of a light component corresponding to the DC component, and then finding the ratio $I(2\omega)/Io$.

8. A method of measuring the magnetic field of an object which generates a magnetic field to be measured, which process comprises, with concurrent application of a given bias magnetic field, directing a light beam, in the vicinity of the object, incident to a magneto-optic element which exhibits a multiple domain structure in the state where no magnetic field is applied, the magnetization components in the adjacent domains along the direction in which a light beam travels being alternately parallel and antiparallel to the light beam direction, said magneto-optic element being a Bi-substituted rare earth iron garnet film formed by liquid-phase epitaxial (LPE) growth, means for applying a magnetic field of variable strength to said magneto-optic element, optical fiber input means and optical fiber output means for optical signs, and a reflector provided on one side of said magneto-optic element, said reflector being provided on a surface of said magneto-optic element; taking out only zero order diffracted light from diffracted light that has passed through said magneto-optic element; determining separately, out of the zero order diffraction light, the intensity of light $I(\omega)$ of a light component which oscillates at the magnetic field frequency $\omega$ of the object of magnetic field measurement and the intensity of light $I(2\omega)$ of a light component which oscillates at a frequency twice as high as the light intensity $I(\omega)$; and then finding the ratio $I(2\omega)/I(\omega)$.

9. A magnetic field measuring apparatus according to claim 5 wherein said magneto-optic element being of such thickness as to limit the temperature dependence of $H_s/\tan\Theta_f$, where $\Theta_f$ is the Faraday rotation angle and $H_s$ is the saturation magnetization.

10. A method for measuring a magnetic field strength of an object by employing a sensor comprising a magneto-optic element which exhibits a multiple domain structure in a state where no magnetic field is applied, wherein magnetization components in adjacent domains of the element along a direction in which a light beam travels are different from one another, the light beam being diffracted by the magneto-optic element, said magneto-optic element being a Bi-substituted rare earth iron garnet film formed by liquid-phase epitaxial (LPE) growth, optical fiber input means and optical fiber output means for optical signals, and a reflector provided on one side of said magneto-optic element, said reflector being provided on a surface of said magneto-optic element, the method comprising the steps of (a) placing the magneto-optic element in the vicinity of an object;

(b) directing a light beam through the magneto-optic element, onto the reflector and back through the element, the element causing the light beam to be diffracted;

(c) measuring the power level of the light beam before it is directed through the element and after it is reflected back through the element and calculating power level attenuation from the measured values; and (d) determining the magnetic field strength of the object from the power level attenuation.

11. A magnetic field sensor according to claim 1 wherein said optical fiber input means and optical fiber output means are located on a side of said magneto-optic element which is opposite to said one side.

* * * * *